(12) United States Patent
Yoshimura

(10) Patent No.: US 7,519,140 B2
(45) Date of Patent: Apr. 14, 2009

(54) AUTOMATIC FREQUENCY CORRECTION PLL CIRCUIT

(75) Inventor: Tsutomu Yoshimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 493 days.

(21) Appl. No.: 11/087,591

(22) Filed: Mar. 24, 2005

(65) Prior Publication Data

US 2005/0226357 A1    Oct. 13, 2005

(30) Foreign Application Priority Data

Apr. 8, 2004    (JP) .............................. 2004-113725

(51) Int. Cl.
  *H03M 1/12*    (2006.01)
(52) U.S. Cl. .................. 375/376; 375/373; 375/374; 375/371; 375/286; 375/287; 375/293; 375/344; 327/156; 327/150; 327/146; 327/145; 331/46; 331/50; 331/55; 331/56; 370/328
(58) Field of Classification Search .................. 375/286, 375/287, 293, 294, 344, 371, 373, 374, 375, 375/376; 327/156, 150, 146, 145; 331/46, 331/50, 55, 56; 370/328
See application file for complete search history.

(56) References Cited

U.S. PATENT DOCUMENTS 6,020,708 A    2/2000   Matsumoto et al.
6,661,294 B2 *  12/2003  Terashima et al. ............ 331/17
6,667,640 B2 *  12/2003  Asano ......................... 327/147

(Continued)

FOREIGN PATENT DOCUMENTS

JP        5-63600 A      3/1993

(Continued)

OTHER PUBLICATIONS

Ravi et al., "10 GHz, 20mW, fast locking, adaptive gain PLLs with on-chip frequency calibration for agile frequency synthesis in a .18µm digital CMOS process," IEEE Symposium on VLSI Circuits Digest of Technical Papers, 2003.

(Continued)

*Primary Examiner*—Shuwang Liu
*Assistant Examiner*—Helene Tayong
(74) *Attorney, Agent, or Firm*—Leydig, Voit & Mayer, Ltd.

(57) ABSTRACT

An automatic frequency correction phase-locked loop (PLL) circuit includes an analog control circuit and a digital control circuit. The digital control circuit includes a High-side comparator and a Low-side comparator which receive an analog control voltage, a state monitor circuit, and a counter and decoder circuit. At least one of the High-side comparator and the Low-side comparator includes a threshold switching circuit which selectively provides a first threshold voltage and a second threshold voltage, the first and second threshold voltages having different magnitudes. When the analog control voltage remains stable between the High-side threshold voltage and the Low-side threshold voltage and the threshold switching circuit is providing the first threshold voltage, the state monitor circuit switches the threshold switching circuit from the first threshold voltage to the second threshold voltage, thereby expanding the interval between the High-side threshold voltage and the Low-side threshold voltage.

12 Claims, 14 Drawing Sheets

U.S. PATENT DOCUMENTS

| | | | |
|---|---|---|---|
| 6,753,711 B2 * | 6/2004 | McCollum et al. | 327/156 |
| 7,120,416 B2 * | 10/2006 | Tomita | 455/340 |
| 2005/0141381 A1 * | 6/2005 | Chen et al. | 369/53.24 |
| 2006/0052074 A1 * | 3/2006 | Minotani et al. | 455/276.1 |
| 2006/0244499 A1 * | 11/2006 | Miyata et al. | 327/156 |

FOREIGN PATENT DOCUMENTS

| | | |
|---|---|---|
| JP | 9-134218 A | 5/1997 |
| JP | 10-285023 | 10/1998 |
| JP | 2003-87117 A | 3/2003 |

OTHER PUBLICATIONS

Wilson et al., "A CMOS Self-Calibrating Frequency Synthesizer," Journal of Solid-State Circuits, Oct. 2000, pp. 1437-1444, vol. 35, No. 10.

* cited by examiner

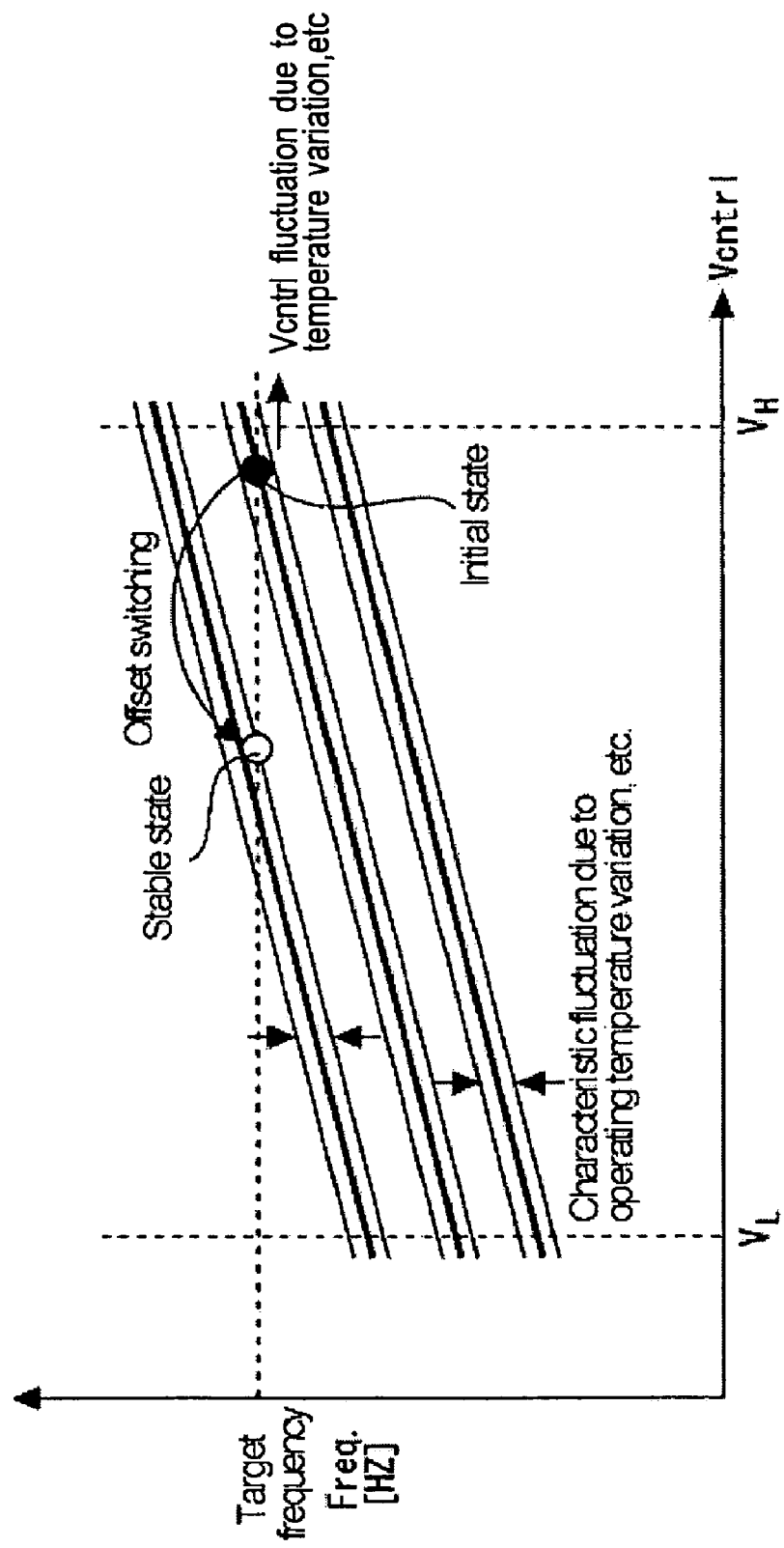

AUTOMATIC FREQUENCY CORRECTION PLL CIRCUIT

BACKGROUND OF THE INVENTION

1. Field of the Invention

The present invention relates to an automatic frequency correction PLL circuit provided with a voltage-controlled oscillator circuit (VCO) having the function of automatic oscillating frequency correction function which detects and automatically corrects an oscillating frequency deviation of this voltage-controlled oscillator circuit.

2. Background Art

In a phase-locked loop (PLL) circuit incorporating a voltage-controlled oscillator circuit, the oscillating frequency of the voltage-controlled oscillator circuit fluctuates due to variations in manufacturing processes, fluctuations in a supply voltage or ambient temperature during operation. To compensate for the fluctuations in this oscillating frequency, it is a general practice to set a wide range of the oscillating frequency beforehand. In this case, the ratio of fluctuation in the oscillating frequency to fluctuation in a control voltage of the voltage-controlled oscillator circuit, that is, VCO gain, is also set to a correspondingly large value.

When this VCO gain is large, when, for example, noise is applied to a node of the control voltage, the fluctuation in the oscillating frequency due to this noise also increases. This produces a timing shift called "jitter" in an output clock of the PLL circuit. In an on-chip PLL circuit which is a PLL circuit incorporating a voltage-controlled oscillator circuit formed on a semiconductor chip, the presence of large jitter in a clock causes the inconvenience of making it difficult to design synchronization of the entire semiconductor chip which constitutes the PLL circuit.

Prior art 1 for improving this noise sensitive characteristic is presented in a thesis titled "10 GHz, 20 mW, fast locking, adaptive gain PLLs with on-chip frequency calibration for agile frequency synthesis in a 0.18 μm digital CMOS process" by A. Ravi and five others at "2003 Symposium on VLSI Circuits Digest of Technical Papers" Session 14-2.

FIG. 10 is a block diagram of the PLL circuit shown in FIG. 16 of prior art 1 and FIG. 11 shows the structure of an internal capacitance section (capacitor) of the voltage-controlled oscillator circuit shown in FIG. 15. The PLL circuit of this prior art 1 carries out rough adjustment in a frequency correction of the voltage-controlled oscillator circuit VCO using bits of a digital control signal (Digital Control), Bit0, Bit1, Bit2, . . . through a digital control circuit including a digital frequency detector, state monitor circuit (State Machine) and counter & decoder during an initial operation, and then carries out fine adjustment in a frequency correction of the voltage-controlled oscillator circuit VCO using an analog control voltage (Vcntrl) through an analog control circuit including a phase frequency detector PFD, charge pump CP and loop filter.

However, the circuit of this prior art 1 has the following Problem 1 and Problem 2 which correspond to the following condition 1 and condition 2.

[Condition 1]

When an analog adjustment unit using the analog control circuit is equal to or smaller than a digital adjustment unit using the digital control circuit, that is, adjustment unit by the minimum capacitor 1C corresponding to the minimum bit bit0 of a digital control signal (Digital Control)

[Problem 1]

After an automatic correction by the digital control circuit, final frequency locking is performed using the analog control circuit. However, under this condition 1, the digital adjustment unit of the oscillating frequency using the digital control circuit is greater than the analog adjustment unit using the analog control circuit, and therefore the analog control voltage (Vcntrl) may be locked to an upper limit or lower limit of the analog adjustment range. In this case, after the locking of the oscillating frequency is completed, if the operating temperature or supply voltage fluctuates, there is a danger of the system becoming uncontrollable because the analog control voltage is set to the upper limit or lower limit.

[Condition 2]

When the analog adjustment unit of the oscillating frequency using the analog control circuit is greater than the digital adjustment unit using the digital control circuit,

[Problem 2]

Under this condition 2, the digital control circuit performs finer oscillating frequency adjustment than the analog control circuit. However, after the locking is completed, if the ambient temperature or supply voltage fluctuates producing a frequency error exceeding the digital adjustment unit using the digital control circuit, the digital control circuit responds to it, which may cause the oscillating frequency to change non-consecutively or discretely in response to the variation of the digital control signal (Digital Control).

Furthermore, as prior art 2, a thesis titled "A CMOS Self-Calibrating Frequency Synthesizer" by William B. Wilson and two others, issued in October 2000 and published in "IEEE JOURNAL OF SOLID-STATE CIRCUITS" VOL. 35, NO. 10, pp1437-1444 is also known. FIG. 12 is an automatic frequency correction PLL circuit shown in FIG. 9 of this thesis. In the circuit in this FIG. 12, it is possible to avoid the Problem 2 by connecting a control voltage of the voltage-controlled oscillator circuit VCO to Vref with a switch SWA set to OFF and switch SWB set to ON, thereby cutting the analog control circuit, adjusting the oscillating frequency through only a digital control signal (Digital Control) using the digital control circuit, and then fixing the digital control circuit so as not to operate, setting the switch SWA to ON and switch SWB to OFF to cause the PLL circuit to perform a normal operation.

However, prior art 2 also has another problem as shown below. That is, even the PLL circuit of prior art 2 cannot compensate the final potential of the locked analog control voltage (Vcntrl), and therefore the operation may be limited to between the upper limit or lower limit of the analog control voltage depending on the situation. Furthermore, according to prior art 2, once the setting is completed, the digital control circuit is fixed thereafter, and so after the locking of the PLL circuit is completed, even if the setting of the oscillating frequency by the digital control circuit becomes no longer optimal due to a variation in the operating environment such as ambient temperature or secular variation, etc., it is not possible to perform readjustment. According to the flow chart in FIG. 10 of prior art 2, this readjustment requires the power to be turned ON again.

Furthermore, as prior art 3, Japanese Patent Application Laid-Open No. 10-285023 is known. FIG. 13 shows the PLL circuit shown in FIG. 1 of prior art 3 in the same form as those of the prior arts in FIG. 10 and FIG. 12. The PLL circuit in FIG. 13 monitors an analog control voltage (Vcntrl), changes the offset frequency of the voltage-controlled oscillator circuit VCO to a higher value when the analog control voltage exceeds a High-side threshold $V_H$ and sets the analog control voltage (Vcntrl) to a value within the range. On the other hand, when the analog control voltage falls below a Low-side threshold $V_L$, the PLL circuit changes the offset frequency to a lower value, and sets the analog control voltage (Vcntrl) to a value within the range.

In this prior art 3, the analog control voltage (Vcntrl) is monitored, and therefore there is an advantage that the control voltage of the voltage-controlled oscillator circuit VCO is compensated more reliably. However, another problem occurs as shown below. That is, since thresholds $V_H$, $V_L$ are fixed, as shown with black bullets in FIG. 14, the frequency is also allowed to be locked to close to the high threshold $V_H$ as the initial state, and therefore once the frequency is locked, when the oscillating frequency characteristic changes with respect to the analog control voltage (Vcntrl) due to a variation of the external temperature, etc., the analog control voltage (Vcntrl) exceeds thresholds $V_H$, $V_L$ and the changes indicated by arrows may occur. Thereafter, the stable state changes as indicated by a white bullet in FIG. 14, but the operation becomes unstable during an offset switching period. Therefore, even if the characteristic fluctuates during a relatively long period such as a variation in ambient temperature or secular variation, it is necessary to prevent offsets from being switched.

In FIG. 14, the vertical axis shows an oscillating frequency Freq.[Hz] of the voltage-controlled oscillator circuit VCO and the horizontal axis shows an analog control voltage (Vcntrl) and shows the control of the oscillating frequency Freq. Three thick straight lines show the control characteristic of the oscillating frequency Freq. by the analog control voltage (Vcntrl) and the thin straight lines above and below these three thick straight lines indicate the width of a characteristic fluctuation due to a temperature variation, etc., during operation.

SUMMARY OF THE INVENTION

The present invention proposes an improved automatic frequency correction PLL circuit capable of solving the aforementioned problems.

According to one aspect of the present invention, an automatic frequency correction PLL circuit provided with an analog control circuit and a digital control circuit, the digital control circuit including a High-side comparator and a Low-side comparator which receive an analog control voltage, a state monitor circuit and a counter & decoder circuit, and especially at least one of the High-side comparator and Low-side comparator is provided with a threshold switching circuit which selectively gives a first threshold and second threshold having different magnitudes, and when the analog control voltage remains between the High-side threshold and the Low-side threshold in a state in which the threshold switching circuit gives the first threshold, the threshold switching circuit switches the first threshold to the second threshold and expands the interval between the High-side threshold and Low-side threshold.

Other and further objects, features and advantages of the invention will appear more fully from the following description.

The features and advantages of the present invention may be summarized as follows.

As described above, in the automatic frequency correction PLL circuit according to the present invention, a digital control circuit is provided with a High-side comparator which receives an analog control voltage, a Low-side comparator, a state monitor circuit and a counter & decoder circuit, and especially at least one of the High-side comparator and Low-side comparator is provided with a threshold switching circuit which selectively gives a first threshold and second threshold which are different in magnitude, and when the threshold switching circuit gives the first threshold, if the analog control voltage remains between the High-side threshold and Low-side threshold, the threshold switching circuit switches the first threshold to the second threshold and expands the interval between the High-side threshold and Low-side threshold, and can thereby avoid unnecessary switching of offsets and provide a stable PLL operation.

BRIEF DESCRIPTION OF THE DRAWINGS

FIG. 14 is an explanation figure of operation of an automatic frequency correction PLL circuit of prior art.

DETAILED DESCRIPTION OF THE PREFERRED EMBODIMENTS

With reference now to the attached drawings, a few embodiments of the present invention will be explained below.

First Embodiment

Figure 1:
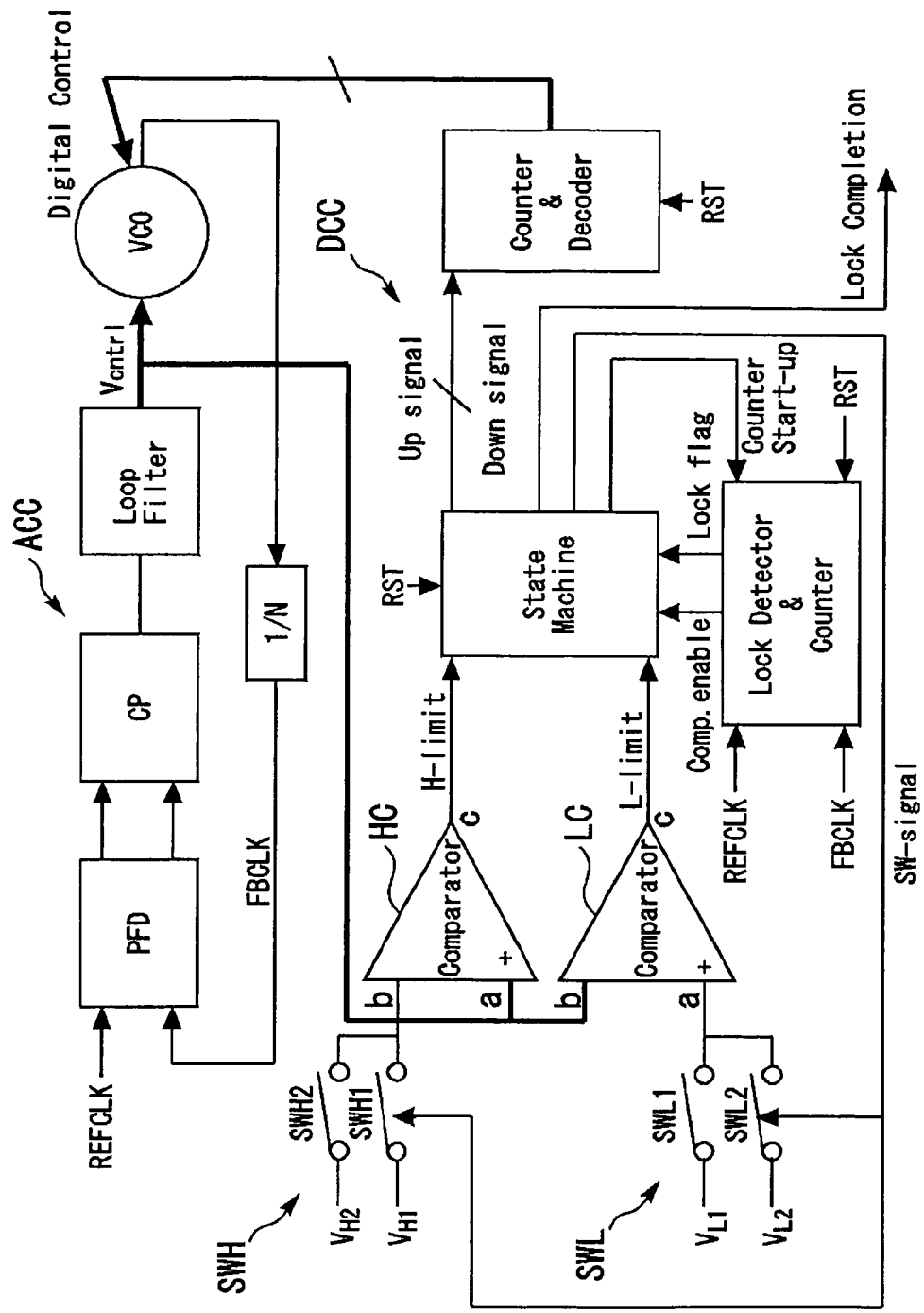
FIG. 1 is a block diagram showing an automatic frequency correction PLL circuit according to First Embodiment.

FIG. 1 is a block diagram showing First Embodiment of an automatic frequency correction PLL circuit according to the present invention. The automatic frequency correction PLL circuit according to this First Embodiment includes a voltage-controlled oscillator circuit VCO, an analog control circuit ACC for this voltage-controlled oscillator circuit and a digital control circuit DCC. The analog control circuit ACC generates an analog control voltage (Vcntrl) and the digital control circuit DCC generates a digital control signal (Digital Control), to control the frequency of the voltage-controlled oscillator circuit VCO.

Figure 2:
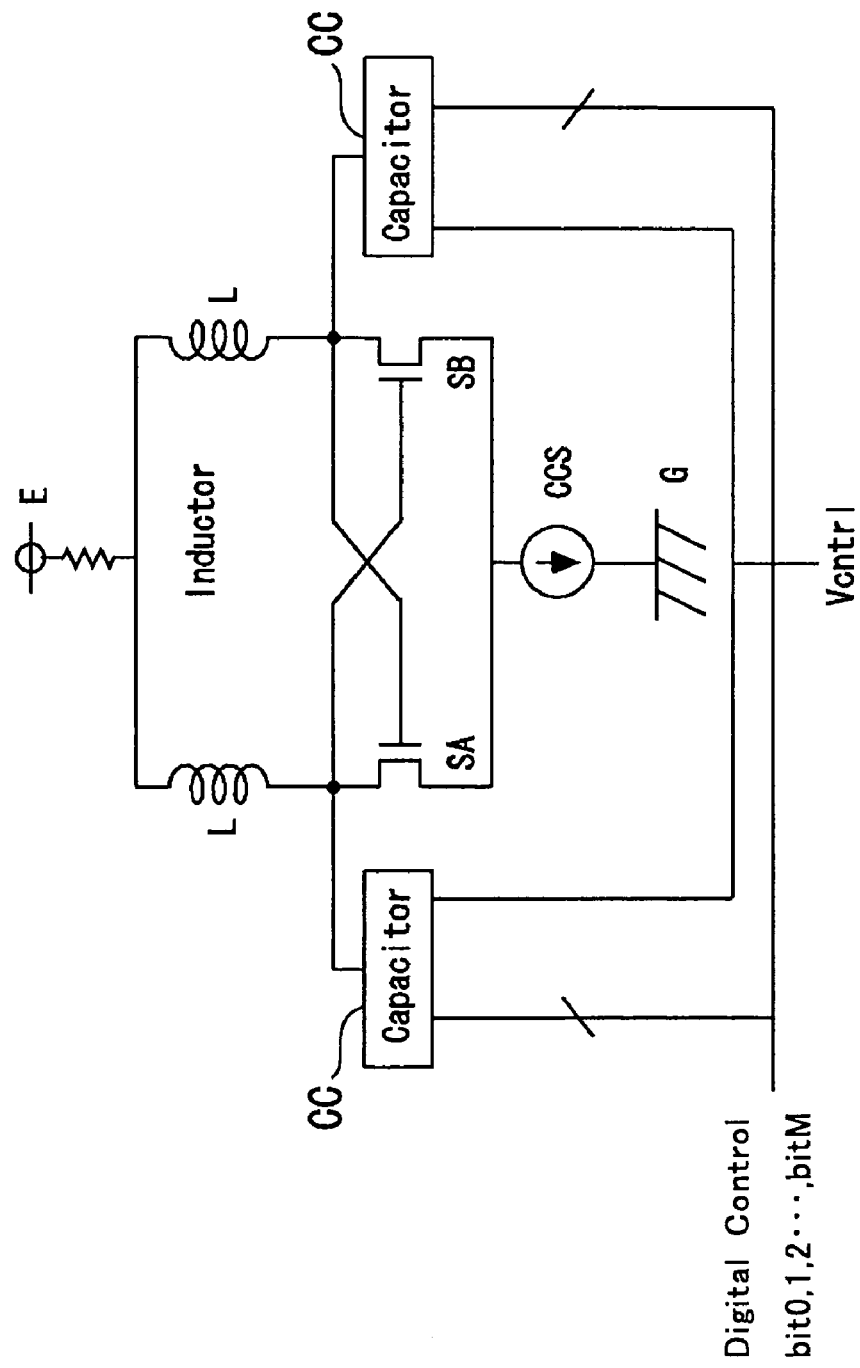
FIG. 2 shows an internal structure of the voltage-controlled oscillator circuit according to First Embodiment.

FIG. 2 shows the internal structure of the voltage-controlled oscillator circuit VCO. The voltage-controlled oscillator circuit VCO is provided with a pair of inductors L, a pair of switches SA, SB which perform switch operations opposite to each other and a pair of capacitor circuits CC. The switches SA, SB are, for example, MOS transistors and connected in series to the inductors L between a power supply terminal E and a reference potential point G. A constant current source CCS is connected between the switches SA, SB and reference potential point G.

The capacitor circuits CC are connected to the inductors L. An analog control voltage (Vcntrl) and digital control signal (Digital Control) are supplied to the respective capacitor circuits CC. The digital control signal (Digital Control) consists of M bit lines; Bit0, Bit1, Bit2, . . . , BitM.

Figure 3:
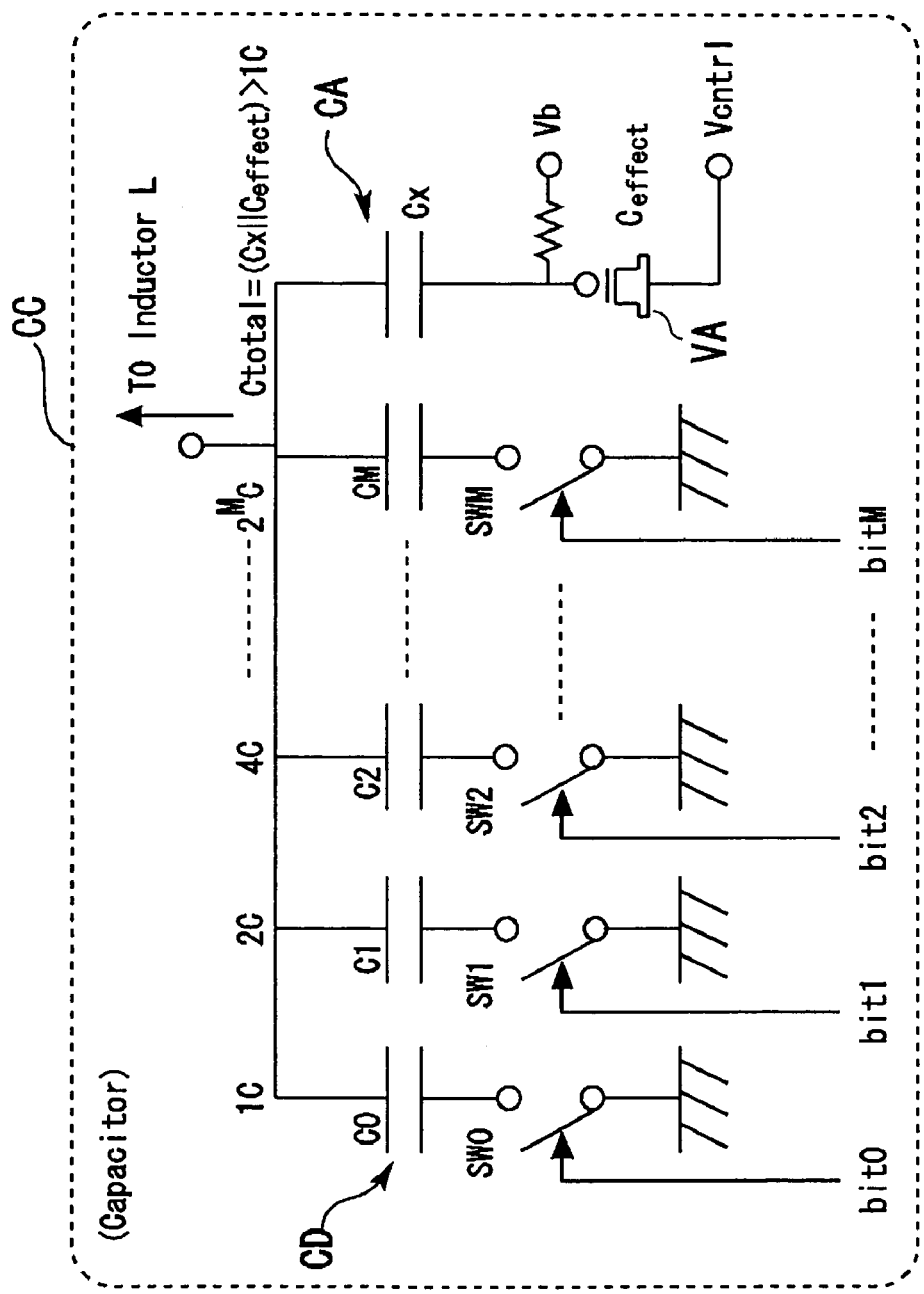
FIG. 3 shows an internal circuit of each capacitor circuit according to First Embodiment.

FIG. 3 shows the internal circuit of each capacitor circuit CC. The capacitor circuit CC includes an analog control capacitance section CA and a digital control capacitance section CD. The analog control capacitance section CA includes a fixed capacitor Cx and a varactor VA which is a variable capacitor. These fixed capacitor Cx and varactor VA are connected in series to each other and one end of the fixed capacitor Cx is connected to the inductor L. An analog control voltage (Vcntrl) is supplied to one end of the varactor VA and a bias voltage Vb is supplied to the other end. When a maximum capacitance of the varactor VA is assumed to be Ceffect, the total capacitance (Ctotal) of the analog control capacitance section CA is given by following (Expression 1) and this becomes a maximum capacitance of the analog control capacitance section CA.

$$Ctotal = Cx \times Ceffect/(Cx + Ceffect) \quad \text{(Expression 1)}$$

The digital control capacitance section CD includes M switches SW0, SW1, SW2, . . . , SWM which are turned ON/OFF by signals of M bit lines; Bit0, Bit1, Bit2, . . . BitM and M capacitors C0, C1, C2, . . . , CM connected in series to their respective switches and one end of each of these capacitors is connected to the inductor L. The capacitors C0, C1, C2, . . . , CM include capacitance values 1C, 2C, 4C, . . . , $2^M$C which are weighted with $2^0=1, 2^1=2, 2^2=4, \ldots, 2^M$ respectively.

The capacitance value of this digital control capacitance section CD is adjusted according to a digital control signal (Digital Control) using a minimum capacitance value 1C corresponding to the minimum bit Bit0 as the adjustment unit. The digital control circuit DCC adjusts the oscillating frequency Freq. of the voltage-controlled oscillator circuit VCO using the adjustment unit corresponding to the adjustment unit 1C of the capacitance value for this digital control capacitance section CD.

The total capacitance (Ctotal) based on the analog control voltage (Vcntrl) of the analog control circuit ACC becomes the maximum adjustment unit at the maximum capacitance Ceffect of the varactor VA and is set to a value greater than the adjustment unit 1C at the digital control capacitance section CD. That is, the total capacitance value (Ctotal) is set so as to satisfy the following (Expression 2).

$$Ctotal > 1C \quad \text{(Expression 2)}$$

The analog control circuit ACC includes a phase frequency detector PFD, a charge pump CP and a loop filter (Loop Filter). A reference clock REFCLK and a feedback clock FBCLK are supplied to the phase frequency detector PFD, the phase frequency detector PFD generates a detection output corresponding to a phase difference between these reference clock REFCLK and feedback clock FBCLK and supplies the detection output to the charge pump CP. This charge pump CP supplies the analog control voltage (Vcntrl) to the voltage-controlled oscillator circuit VCO through the loop filter (Loop Filter). The feedback clock FBCLK is created by dividing the oscillation output of the voltage-controlled oscillator circuit VCO using a 1/N frequency divider.

The digital control circuit DCC includes a High-side comparator HC, a Low-side comparator LC, a state monitor circuit (State Machine), a lock detector & counter and a counter & decoder.

The High-side comparator HC includes a + input a and a − input b and an output c, and a High-side threshold switching circuit SWH is connected to the − input b of this High-side comparator HC. This High-side threshold switching circuit SWH includes a pair of switches SWH1, SWH2, and a High-side threshold $V_{H1}$ is given to the switch SWH1 and a High-side threshold $V_{H2}$ ($V_{H2}>V_{H1}$) is given to the switch SWH2. Likewise, the Low-side comparator LC includes a + input a, a − input b and an output c, and a Low-side threshold switching circuit SWL is connected to the + input a of this Low-side comparator LC. This Low-side threshold switching circuit SWL includes a pair of switches SWL1, SWL2 and a Low-side threshold $V_{L1}$ is given to the switch SWL1 and a Low-side threshold $V_{L2}$ ($V_{L2}<V_{L1}$) is given to the switch SWL2.

The analog control voltage (Vcntrl) from the analog control circuit ACC is given to both the + input a of the High-side comparator HC and the − input b of the Low-side comparator LC. At the High-side comparator HC, the digital code (H-limit) of the output c becomes High when the + input a is greater than the − input b and the digital code (H-limit) of the output c becomes Low when the + input a is smaller than the − input b. At the Low-side comparator LC, the digital code (L-limit) of the output c becomes High when the + input a is greater than the − input b and the digital code (L-limit) of the output c becomes Low when the + input a is smaller than the − input b.

The lock detector & counter receives the reference clock REFCLK, feedback clock FBCLK, counter start-up signal and reset signal RST and generates a comparator enable signal (Comp. enable) and a lock signal (Lock flag). The reference clock REFCLK and feedback clock FBCLK are the same clocks as the reference clock REFCLK and feedback clock given to the phase frequency detector PFD of the analog control circuit ACC, and this reference clock REFCLK or feedback clock FBCLK is counted by the lock detector & counter based on a counter start-up signal. The counter start-up signal is given from the state monitor circuit (State Machine).

The state monitor circuit (State Machine) receives the digital code (H-limit) from the High-side comparator HC and the digital code (L limit) from the Low-side comparator LC and a reset signal RST, and generates an up signal, a down signal, a lock completion signal (Lock Completion), a switch signal (SW-Signal) and a counter start-up signal. The up signal and down signal are supplied to the counter & decoder, the counter start-up signal is supplied to the lock detector & counter, the switch signal (SW-Signal) is used to switch the High-side threshold switching circuit SWH and to switch the Low-side threshold switching circuit SWL.

The counter & decoder receives the up signal, down signal and reset signal RST, and generates a digital control signal (Digital Control). More specifically, the counter & decoder counts the number of up signal and down signal pulses and generates a corresponding digital control signal (Digital Control).

Figure 4:
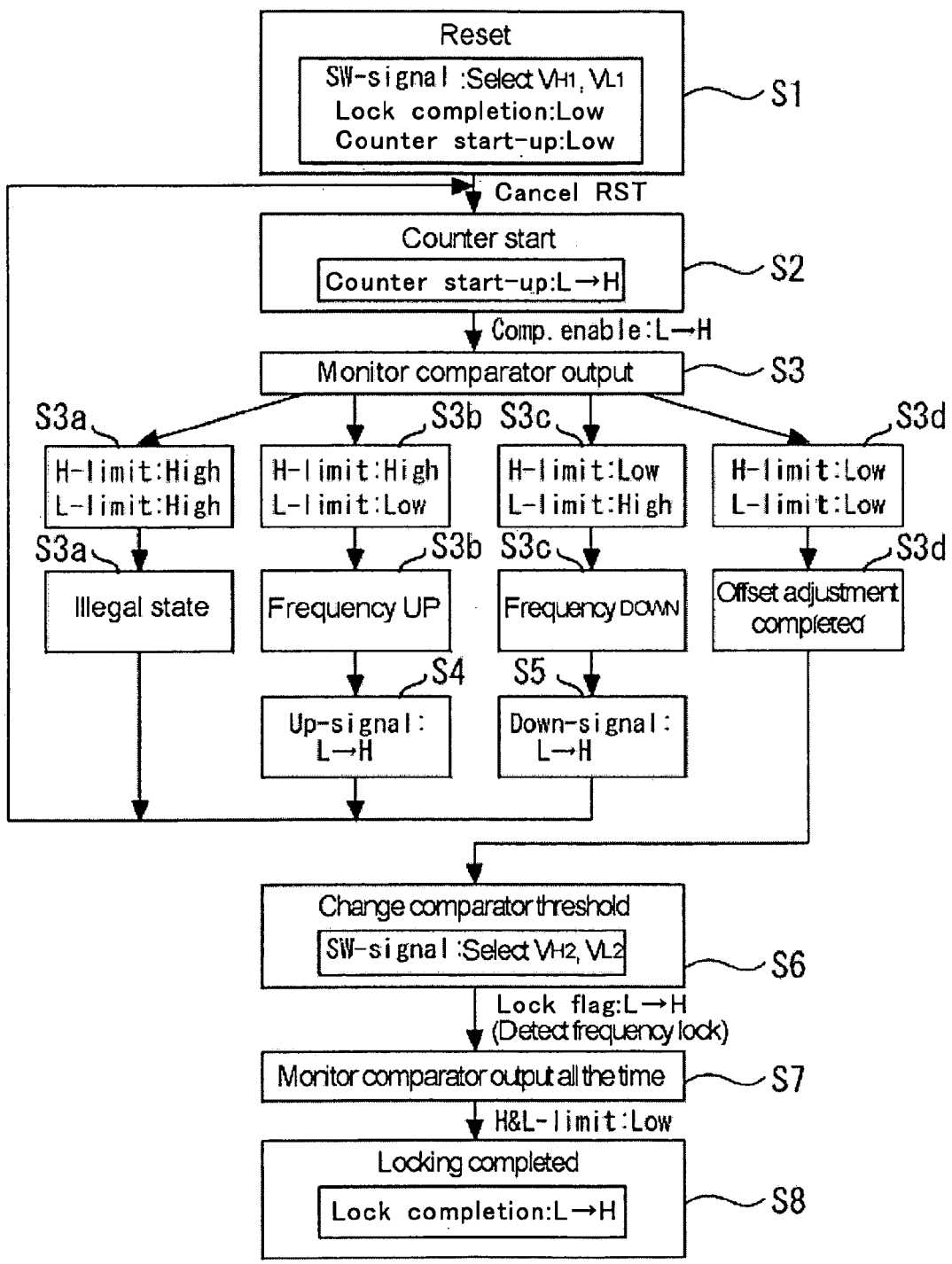
FIG. 4 is a flow chart of the state monitor circuit according to First Embodiment.

FIG. 4 is a flow chart of the state monitor circuit (State Machine) according to First Embodiment. The operation of First Embodiment will be explained with reference to this FIG. 4. The flow chart in FIG. 4 includes steps from step S1 to step S8.

In First Embodiment, the maximum adjustment unit of the total capacitance (Ctotal) based on the analog control voltage (Vcntrl) of the analog control circuit ACC is set to be greater than the adjustment unit 1C at the digital control capacitance section CD as shown in (Expression 2), and the offset frequency of the voltage-controlled oscillator circuit VCO is adjusted by the analog control circuit ACC first.

In first step S1 of the flow chart in FIG. 4, a reset operation is performed. In this reset operation, the reset signal RST becomes High and this is given to the lock detector & counter, the state monitor circuit (State Machine) and the counter & decoder. As a result, the lock detection operation and counter operation of the lock detector & counter are reset and the counter & decoder is also reset. By resetting this counter & decoder, the digital control signal (Digital Control) becomes a fixed digital code.

Based on the reset, the state monitor circuit (State Machine) turns ON the switches SWH1, SWL1 and turns OFF the switches SWH2, SWL2 through the switch signal (SW-Signal), and gives the High-side threshold $V_{H1}$ to the − input b of the High-side comparator HC and the Low-side threshold $V_{L1}$ to the + input a of the Low-side comparator LC. At the same time, the lock completion signal (Lock completion) is set to Low and the counter start-up signal is also sets to Low.

The next step S2 is a count start step. In this step S2, the reset is canceled, the reset signal RST is set to Low, and the state monitor circuit (State Machine) sets the counter start-up signal to High. In response to this, the lock detector & counter starts an internal counter. After a certain period of time, the lock detector & counter sets the comparator enable signal (Comp. Enable) to High. In this way, the state monitor circuit (State Machine) monitors the digital codes from the comparators HC, LC in step S3, receives the digital codes (H-limit), (L-limit) from the comparators HC, LC and determines the control operation based on the combination of the digital codes. The counter operation of the lock detector & counter is carried out to provide a certain standby period until the operations of the analog control voltage (Vcntrl) of the voltage-controlled oscillator circuit VCO and the comparators HC, LC become stable.

In step S3, the combination of the digital codes (H-limit) and (L-limit) obtained from the comparators HC, LC is anyone of the following four states (a), (b), (c) and (d).

State (a): As shown in step S3$a$, this is an illegal state with the digital code (H-limit) set to High and the digital code (L-limit) also set to High.

This state (a) means that the operations of the comparators HC and LC are not stable, and in this state (a), the counter start-up signal is set to High and the lock detector & counter starts a count up again.

State (b): As shown in step S3$b$, the digital code (H-limit) is High and the digital code (L-limit) is Low. This state means that the analog control voltage (Vcntrl) has exceeded an upper limit, that is, High-side threshold $V_{H1}$ and fallen below a lower limit, that is, Low-side threshold $V_{L1}$, and this state is expressed by (Expression 3) below.

$$\text{Vcntrl} > V_{H1}, \text{Vcntrl} > V_{L1} \qquad \text{(Expression 3)}$$

This state means that the offset frequency needs to be increased. In this state, the state monitor circuit (State Machine) sets the up signal to High in step S4 and this up signal causes the digital control signal (Digital Control) of the counter & decoder to increase the offset frequency of the voltage-controlled oscillator circuit VCO.

State (c): As shown in step S3$c$, the digital code (H-limit) is Low and the digital code (L-limit) is High. This state means that the analog control voltage (Vcntrl) is equal to or lower than the upper limit $V_{H1}$ and equal to or lower than the lower limit $V_{L1}$ and this state is expressed by (Expression 4) below.

$$\text{Vcntrl} \leq V_{H1}, \text{Vcntrl} \leq V_{L1} \qquad \text{(Expression 4)}$$

This state means that the offset frequency needs to be decreased. In this state, the state monitor circuit (State Machine) sets the down signal to High in step S5, and this down signal causes the digital control signal (Digital Control) of the counter & decoder to decrease the offset frequency of the voltage-controlled oscillator circuit VCO.

State (d): As shown in step S3$d$, the digital code (H-limit) is Low and the digital code (L-limit) is also Low. This state means a state in which the analog control voltage (Vcntrl) remains between the upper limit and lower limit and is expressed by (Expression 5) below.

$$V_{H1} \geq \text{Vcntrl} \geq V_{L1} \qquad \text{(Expression 5)}$$

This state means that the offset adjustment has been completed.

In state (a), by a counter start-up signal or by setting a counter start signal to High after the up signal and down signal become High in steps (b), (c), the respective processes move back to step S2 and digital codes are monitored again in step S3. This operation is repeated until the state of the digital code becomes state (d) and all signals are controlled to the state (d).

After being controlled to the state (d), thresholds of the comparators HC, LC are changed in step S6. In this step S6, the switch signal (SW-Signal) switches the High-side threshold switching circuit SWH to increase the High-side threshold from $V_{H1}$ to $V_{H2}$ and switches the Low-side threshold switching circuit SWL to decrease the Low-side threshold from $V_{L1}$ to $V_{L2}$. As a result of switching this High-side threshold switching circuit SWH and Low-side threshold switching circuit SWL, the threshold range is expanded from the range of $V_{L1}$-$V_{H1}$ to the range of threshold $V_{L2}$-$V_{H2}$.

Furthermore, in step S6, the lock detector & counter generates a lock signal (Lock Flag).

In next step S7, the state monitor circuit (State Machine) receives a lock signal (Lock Flag), changes the monitoring of the comparators HC, LC to an all-the-time-monitoring state irrespective of a comparator enable signal (Comp. enable), monitors the digital codes (H-limit), (L-limit) of the comparators HC, LC all the time, and since both the digital codes (H-limit), (L-limit) are Low, the lock completion signal (Lock completion) is set to High.

As shown above, according to First Embodiment, when digital adjustment of the offset frequency by the digital control circuit DCC is completed, it is possible to contain the control voltage within a desired range reliably. Furthermore, after digital adjustment is completed, the thresholds of the comparators HC, LC are changed and expanded to a wider threshold range, and therefore the operation can be more stabilized. For example, when the threshold range is expanded from the initially specified ($V_{L1}$ to $V_{H1}$) to ($V_{L2}$ to $V_{H2}$), after locking is completed, even if the initially specified range ($V_{L1}$ to $V_{H1}$) is exceeded due to fluctuations of ambient temperature, etc., the digital codes do not change within the expanded threshold range and it is possible to apply the analog control circuit ACC to adjust the offset frequency.

Second Embodiment

Figure 5:
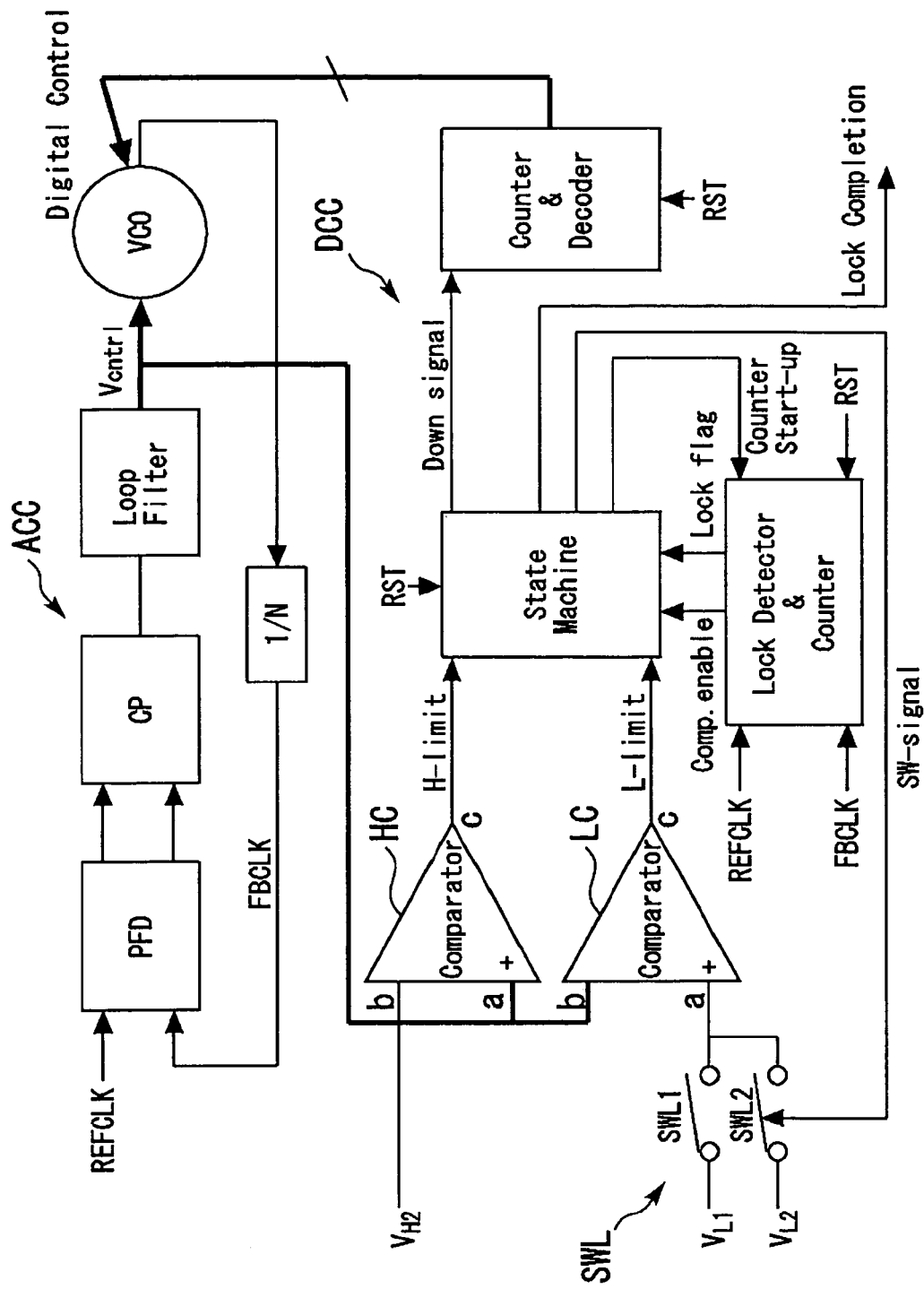
FIG. 5 is a block diagram showing an automatic frequency correction PLL circuit according to Second Embodiment.

FIG. 5 shows Second Embodiment of an automatic frequency correction PLL circuit according to the present invention. First Embodiment is constructed in such a way that High-side thresholds $V_{H1}$, $V_{H2}$ are selectively given to the High-side comparator HC and Low-side thresholds $V_{L1}$, $V_{L2}$ are selectively given to the Low-side comparator LC, while in this Second Embodiment, one High-side threshold $V_{H2}$ is given to the High-side comparator HC fixedly. As in the case of First Embodiment, Low-side thresholds $V_{L1}$, $V_{L2}$ are selectively given to the Low-side comparator LC by a switch signal (SW Signal) from the state monitor circuit (State Machine). According to this structure, in Second Embodiment, only a down signal is given from the state monitor circuit (State Machine) to the counter & decoder and the up signal is not given. The rest of the structure is the same as that in First Embodiment.

Figure 6:
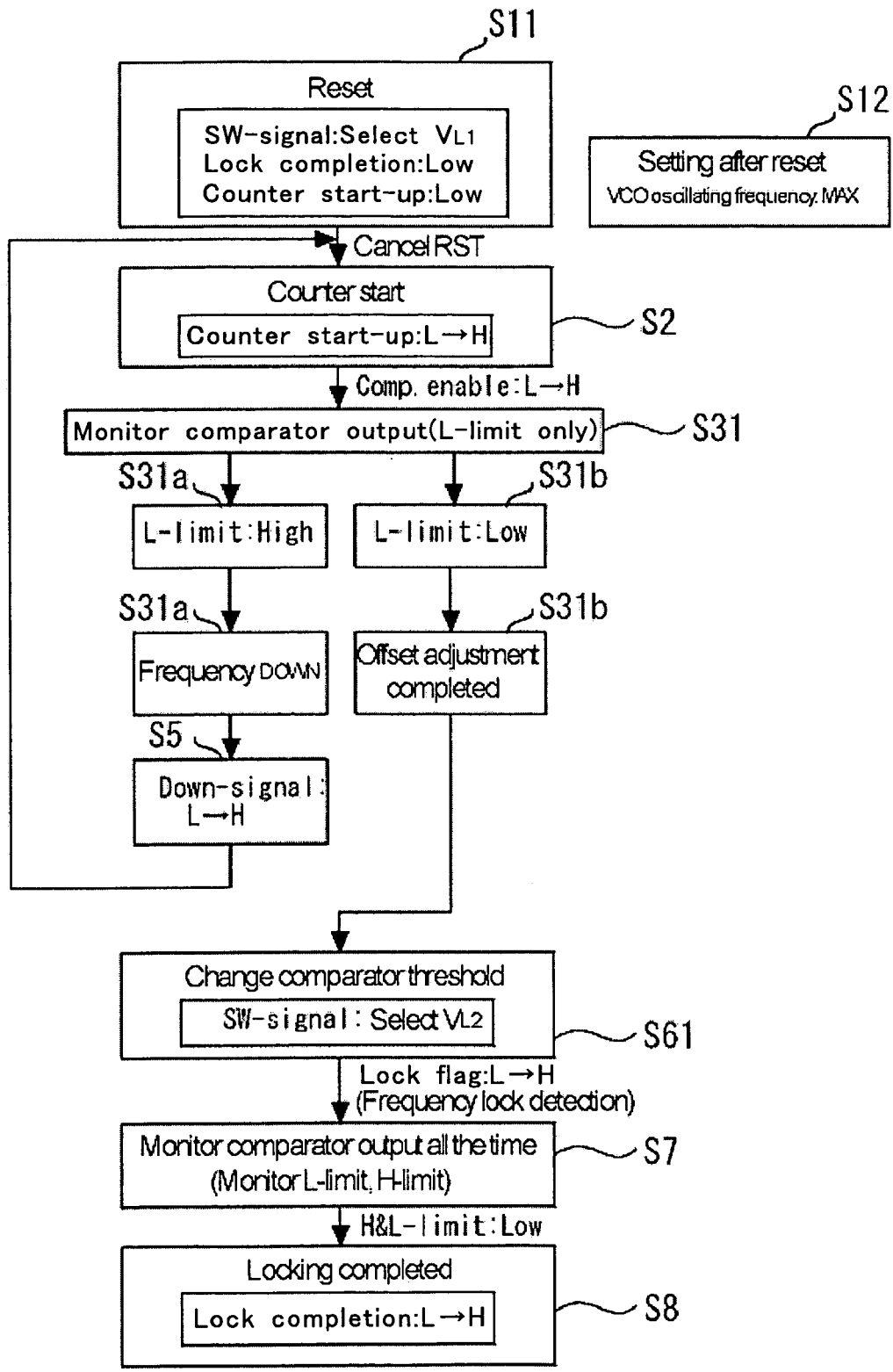
FIG. 6 is a flow chart of the state monitor circuit according to Second Embodiment.

FIG. 6 shows a flow chart of the state monitor circuit (State Machine) in this Second Embodiment. The operation of Second Embodiment will be explained with reference to this FIG. 6.

The operation in step S11 is a reset operation which is similar to that in step S1 in FIG. 4, but in Second Embodiment, the offset frequency of the voltage-controlled oscillator circuit VCO is set to a maximum value Max as shown in step S12.

In the reset operation in step S11, the reset signal RST becomes High and this reset signal is given to the lock detector & counter, state monitor circuit (State Machine) and counter & decoder. As a result, the lock detection operation and counter operation of the lock detector & counter are reset and the counter & decoder is also reset. By resetting this counter & decoder, in Second Embodiment, the digital control signal (Digital Control) becomes a digital code which gives a maximum value Max to the voltage-controlled oscillator circuit VCO.

Based on the reset, the state monitor circuit (State Machine) turns ON the switch SWL1 and turns OFF the switch SWL2 through the switch signal (SW-Signal). A High-side threshold $V_{H2}$ is always given to the − input b of the High-side comparator HC, while a Low-side threshold $V_{L1}$ is given to the + input a of the Low-side comparator LC in this step. In addition, a lock completion signal (Lock completion) becomes Low and the counter start-up signal also becomes Low.

Next step S2 is a count start step. In this step S2, a reset is canceled, the reset signal RST becomes Low and the state monitor circuit (State Machine) sets the counter start-up signal to High. In response to this, the lock detector & counter starts an internal counter. After a certain period of time, the lock detector & counter sets the comparator enable signal (Comp. Enable) to High. In this way, the state monitor circuit (State Machine) monitors digital codes from the comparators HC, LC in step S31, receives digital codes (H-limit), (L-limit) from the comparators HC, LC, but in this Second Embodiment, the digital code (H-limit) from the High-side comparator HC is not monitored and only the digital code (L-limit) of the Low-side comparator LC is monitored and the control operation is determined based thereon. The counter operation of the lock detector & counter is carried out to provide a certain standby period until the analog control voltage (Vcntrl) of the voltage-controlled oscillator circuit VCO and the operations of the comparators HC, LC become stable.

In this Second Embodiment, the following states (a) and (b) are monitored.

State (a): As shown in step S31a, this is a state in which the digital code (L-limit) is High and the analog control voltage (Vcntrl) with respect to the voltage-controlled oscillator circuit VCO is lower than the lower limit. The state monitor circuit (State Machine) sets the down signal to High for the counter & decoder and decreases the offset frequency of the voltage-controlled oscillator circuit VCO using a digital control signal (Digital Control).

State (b): As shown in step S31b, the digital code (L-limit) is Low and the analog control voltage (Vcntrl) with respect to the voltage-controlled oscillator circuit VCO remains within a desired range.

In state (a), the process moves back to step S2 by setting the counter start signal to High after the down signal becomes High in step S5 and the digital code (L-limit) is monitored again in step S3. This operation is repeated until the digital code (L-limit) is put in the state (b), and the voltage-controlled oscillator circuit VCO is controlled to the state in state (b).

In state (b), the threshold of the comparator LC is changed in step S61. In this step S61, the switch signal (SW-signal) switches the Low-side threshold switching circuit SWL, decreases the Low side threshold from $V_{L1}$ to $V_{L2}$ and expands the threshold range from the range of $V_{L1}$-$V_{H2}$ to the range of $V_{L2}$-$V_{H2}$.

Furthermore, in step S61, the lock detector & counter generates a lock signal (Lock Flag).

In the next step S7, the state monitor circuit (State Machine) receives the lock signal (Lock Flag), switches the monitoring of the comparators HC. LC to the all-the-time-monitoring state irrespective of a comparator enable signal (Comp. enable), monitors the digital codes (H-limit), (L-limit) of the comparators HC, LC all the time and sets the lock completion signal (Lock completion) to High because both the digital codes (H-limit), (L-limit) are Low.

In this Second Embodiment, because of the expansion of the threshold range in step S61, it is possible to operate the PLL circuit more stably and at the same time reduce the number of states detected by the state monitor circuit (State Machine) to two states (a) and (b) and thereby simplify the logic.

In Second Embodiment, the High-side fixed threshold $V_{H2}$ is given to the High-side comparator HC, the Low-side threshold switching circuit SWL is provided for the Low-side comparator LC and the Low-side thresholds $V_{L1}$, $V_{L2}$ are selectively given. However, even when the High-side threshold switching circuit SWH is provided for the High-side comparator HC, High-side thresholds $V_{H1}$, $V_{H2}$ are selectively given and the Low-side threshold $V_{L2}$ is fixedly given to the Low-side comparator LC, it is possible to obtain similar effects. In this case, the offset frequency of the voltage-controlled oscillator circuit VCO is set to a minimum value Min in the reset operation in step S11, the state monitor circuit (State Machine) monitors only the digital code (H-limit) from the High-side comparator HC, and only the up signal instead of the down signal is given to the counter & decoder.

Third Embodiment

Figure 7:
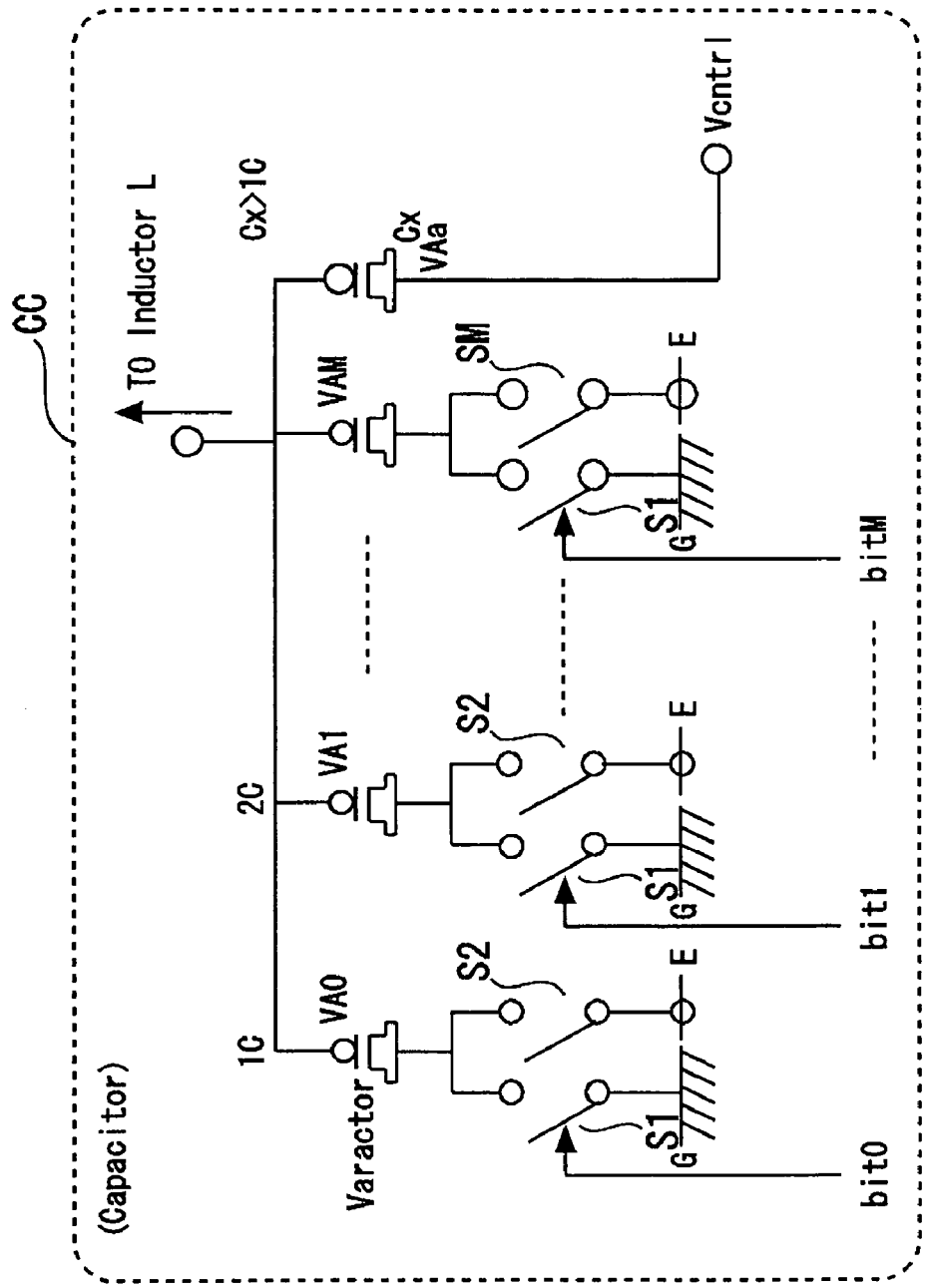
FIG. 7 shows a capacitor circuit in Third Embodiment.

This Third Embodiment uses a capacitor circuit CC shown in FIG. 7 instead of the capacitor circuit CC shown in FIG. 3 for the capacitor circuit CC in First Embodiment. It is also possible to use the capacitor circuit CC shown in FIG. 7 for the capacitor circuit CC in Second Embodiment instead of the capacitor circuit CC shown in FIG. 3.

In the capacitor circuit CC shown in FIG. 7, the analog control capacitance section CA is constructed of a varactor VAa which is a variable capacitor and one end of this varactor VAa is connected to an inductor L and an analog control voltage (Vcntrl) is given to the other end. Suppose the capacitor of this varactor VAa is Cx and the maximum value is Cxmax.

Varactors VA0, VA1, . . . , VAM which are variable capacitors are also used for the digital control capacitance section CD. One end of each varactor is connected to the inductor L and the other end is connected to switches s1, s2 controlled by their respective bits of the digital control signal (Digital Control); Bit0, Bit1, ..., BitM. Each switch s1 is connected to a reference potential point G such as ground and each switch s2 is connected to a power supply terminal E.

Magnitudes of the varactors VA0, VA1, ..., VAM are set so as to give the respective capacitors 1C, 2C, ..., $2^M$C when, for example, the switch s1 is turned OFF and the switch s2 is turned ON and the varactor VA0 gives a minimum capacitor 1C, and this capacitor 1C is a minimum adjustment capacitance of the digital control capacitance section CD and this determines the adjustment unit of the digital control circuit DCC.

In this Third Embodiment, the varactors are used for both the analog control capacitance section CA and digital control capacitance section CD, and therefore it is possible to satisfy following (Expression 6) as in the case of (Expression 2) in First Embodiment irrespective of the variation in the varactor capacitance depending on the process.

$$Cxmax > 1C \quad \text{(Expression 6)}$$

Fourth Embodiment

Figure 8:
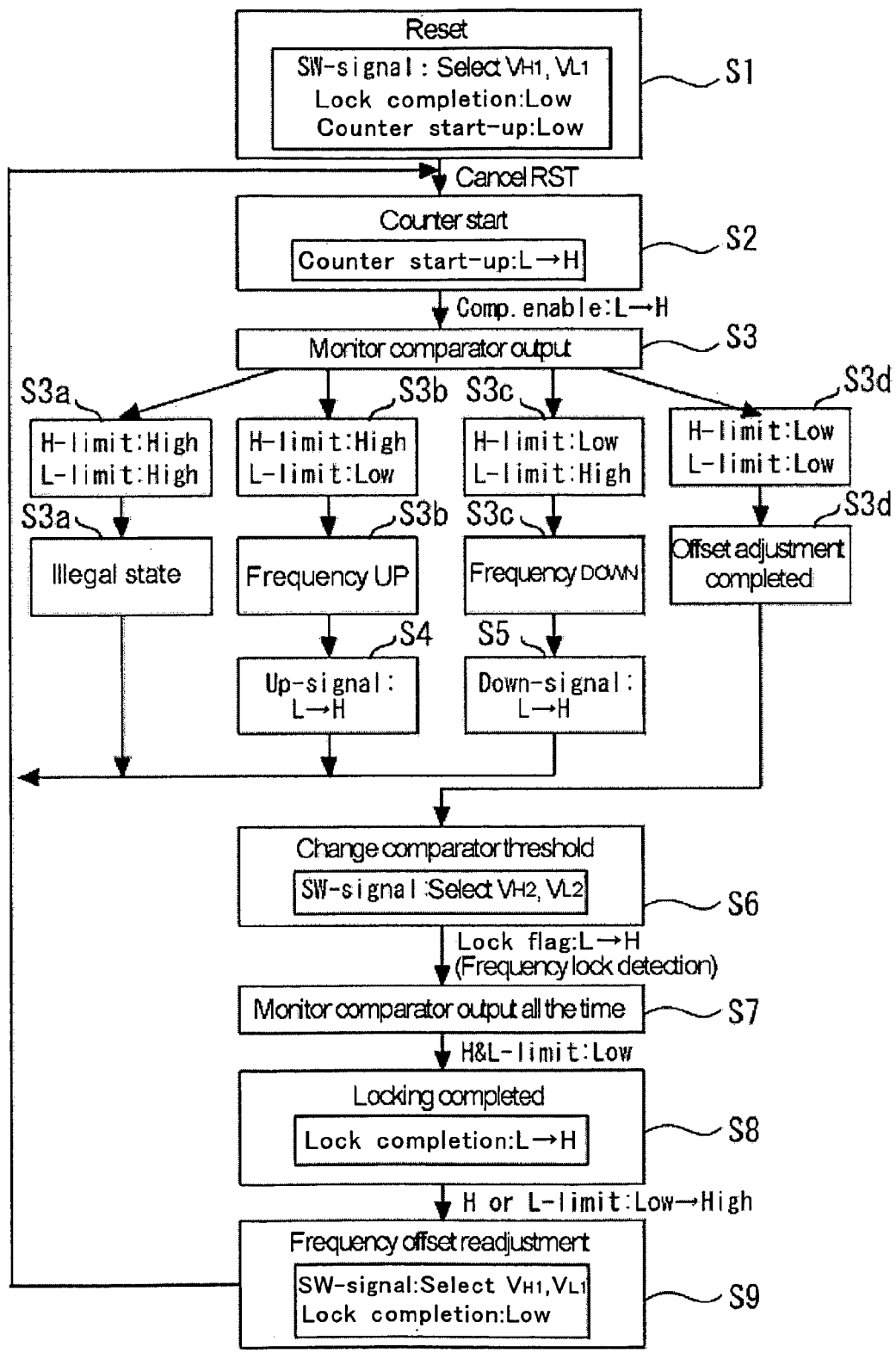
FIG. 8 is a flow chart of the state monitor circuit according to this Fourth Embodiment.

This Fourth Embodiment readjusts an offset frequency after completion of locking in addition to First Embodiment. FIG. 8 shows a flow chart of a state monitor circuit (State Machine) according to this Fourth Embodiment. This flow chart corresponds to the flow chart of the state monitor circuit (State Machine) according to First Embodiment shown in FIG. 4 with a frequency offset readjustment in step 9 added. The rest of the structure is the same as that of First Embodiment.

For example, after completion of locking, when the offset frequency set in an initial operation no longer becomes optimal due to an environmental variation such as temperature fluctuation and secular variation and the offset frequency changes to an approximate value beyond the range of the threshold expanded in step S6 (the Low-side threshold $V_{L2}$~ the High-side threshold $V_{H2}$), the thresholds are returned in step S9 in FIG. 8 to $V_{H1}$ and $V_{L1}$ and the digital control circuit DCC performs readjustment of the offset frequency in step S2. Through this readjustment, the operation of the PLL circuit with an optimal control voltage becomes possible when the locking is completed again in step S8.

Step S9 of readjusting an offset frequency according to this Fourth Embodiment can also be added to the flow chart by the state monitor circuit (State Machine) in Second Embodiment shown in FIG. 6. In this case, step S9 is carried out after step S8, and readjustment is carried out in step S2 to readjust the offset frequency.

Fifth Embodiment

Figure 9:
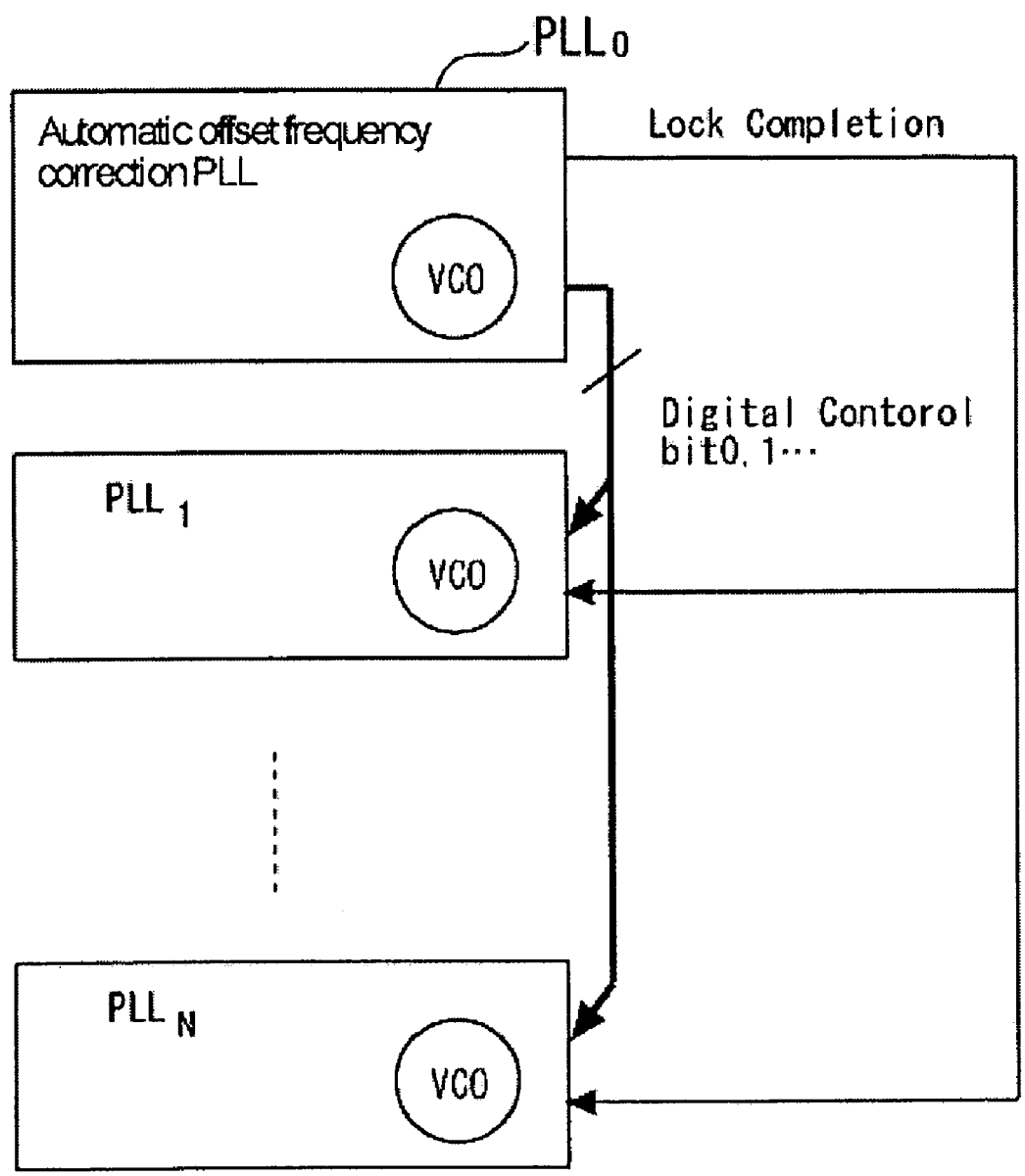
FIG. 9 is a block diagram showing an automatic frequency correction PLL circuit according to Fifth Embodiment.
Figure 10:
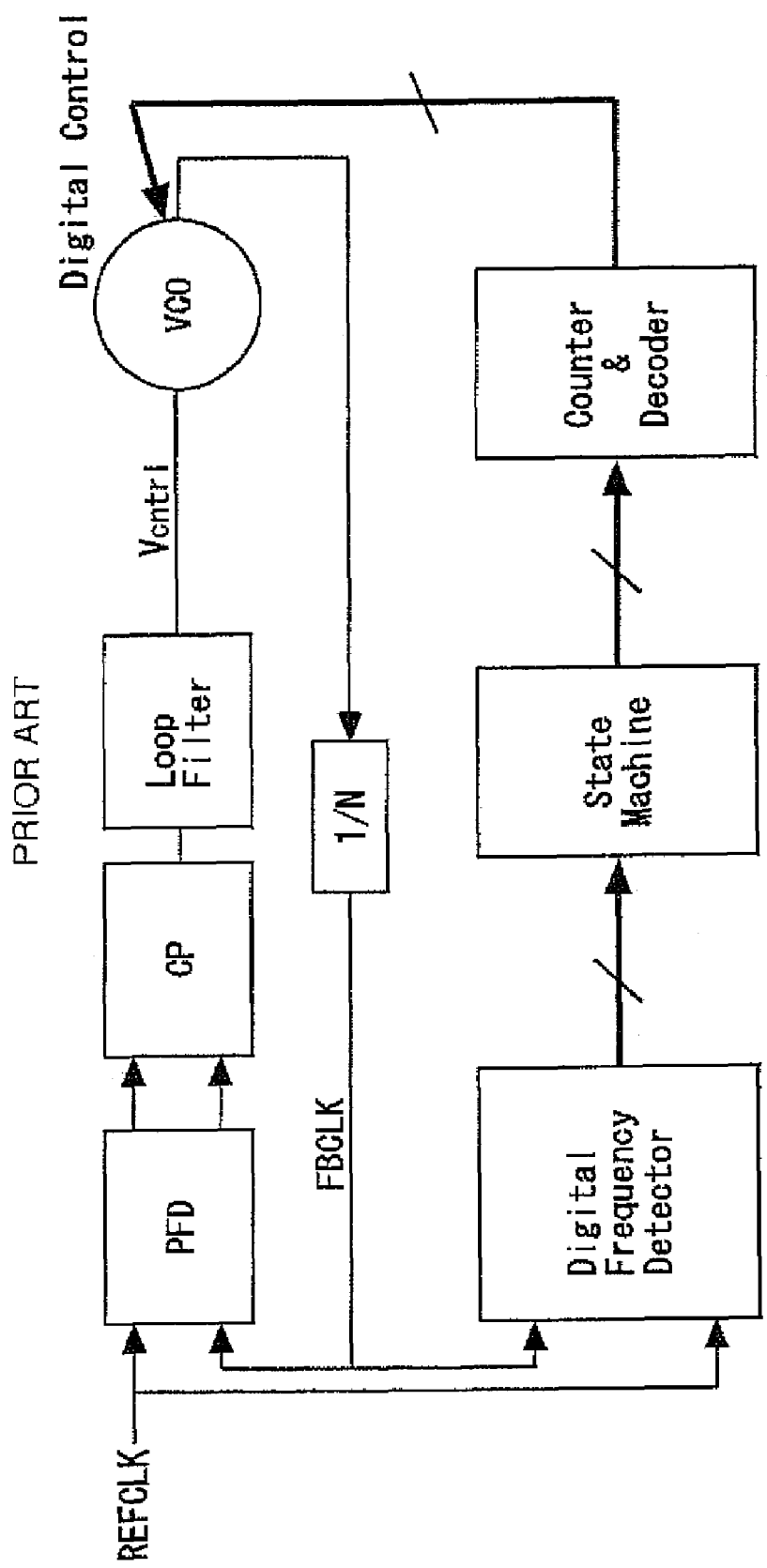
FIG. 10 is a block diagram of an automatic frequency correction PLL circuit of prior art 1.
Figure 11:
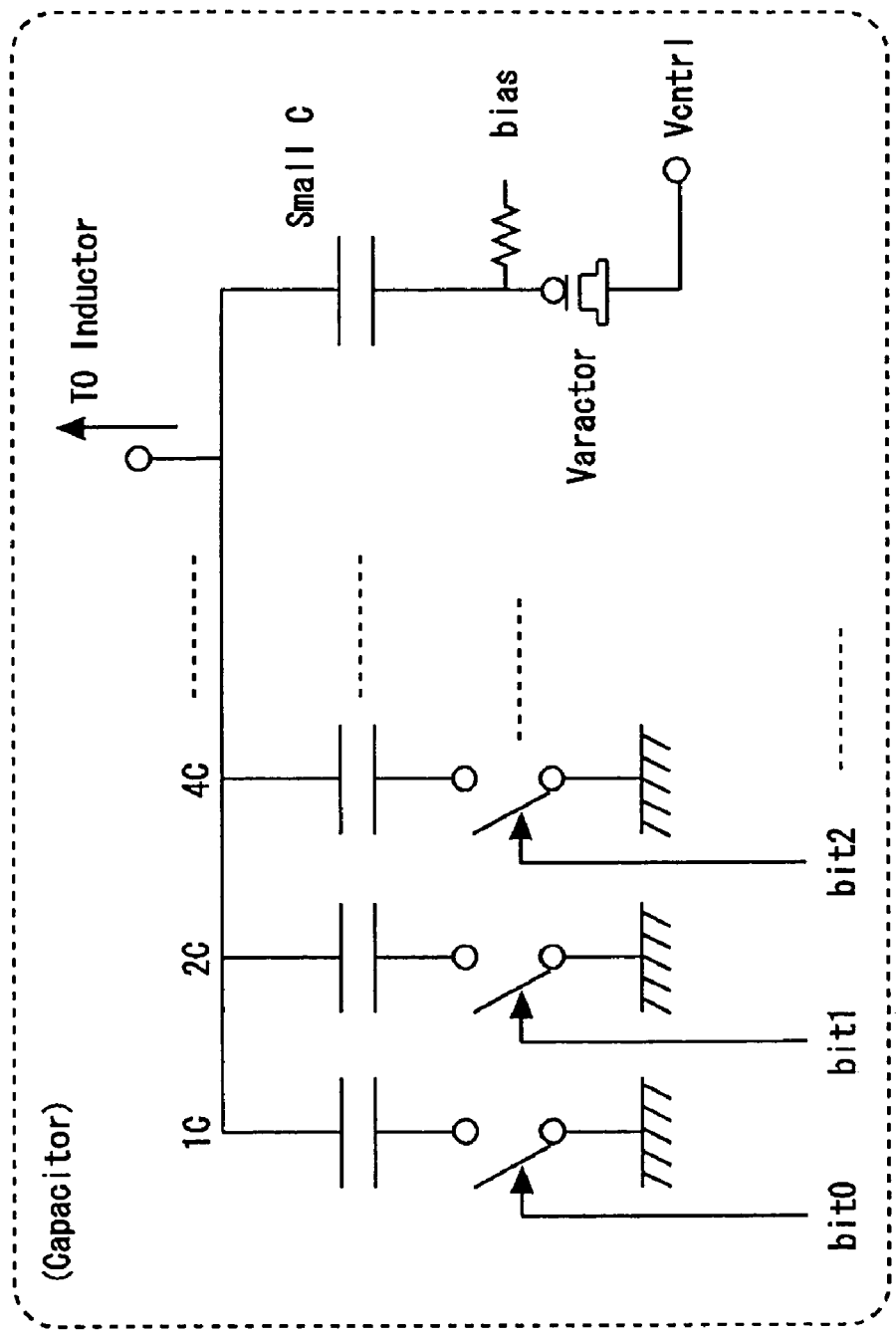
FIG. 11 shows an internal circuit of each capacitor circuit according to prior art.
Figure 12:
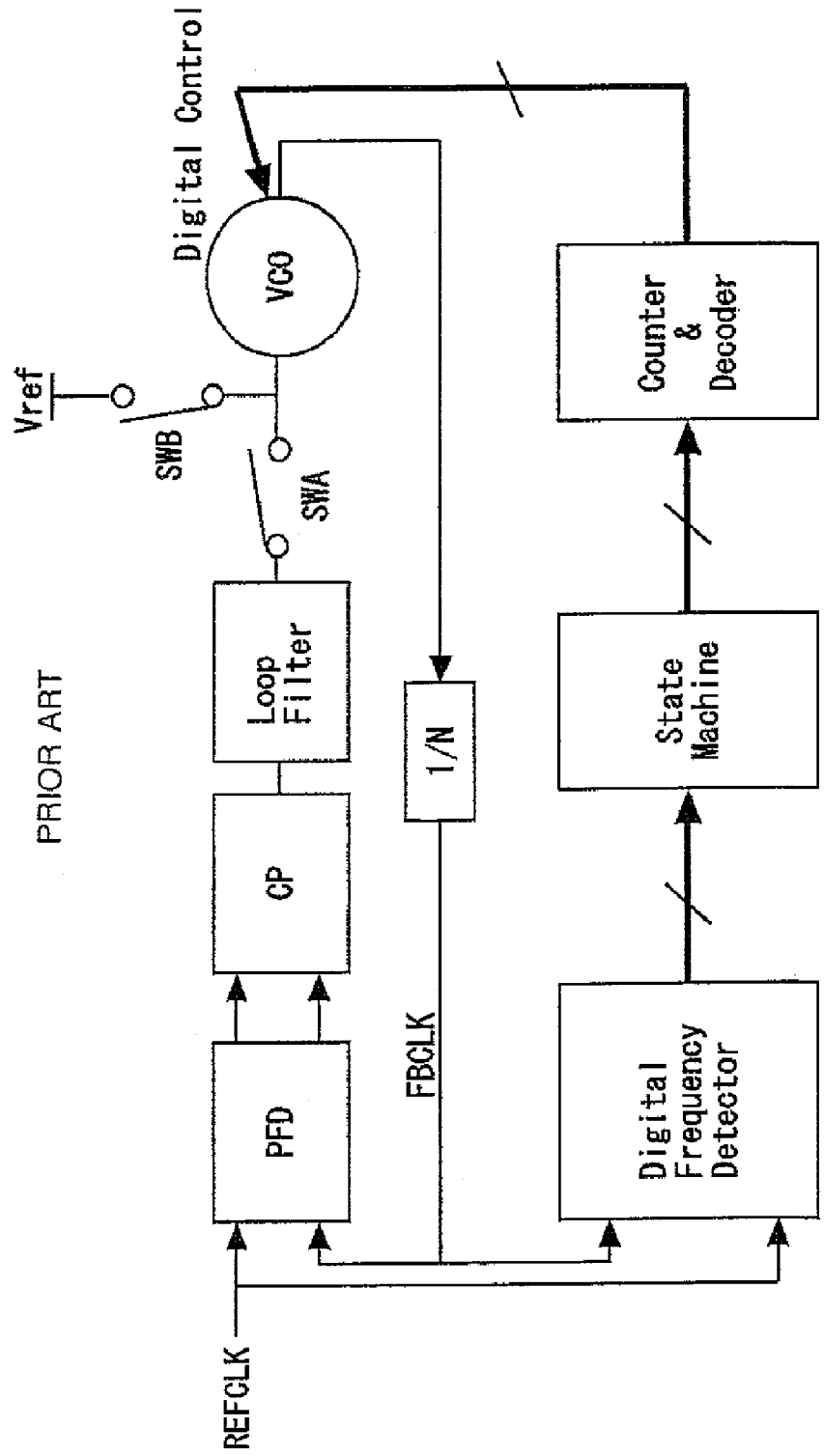
FIG. 12 is a block diagram of an automatic frequency correction PLL circuit of prior art 2.
Figure 13:
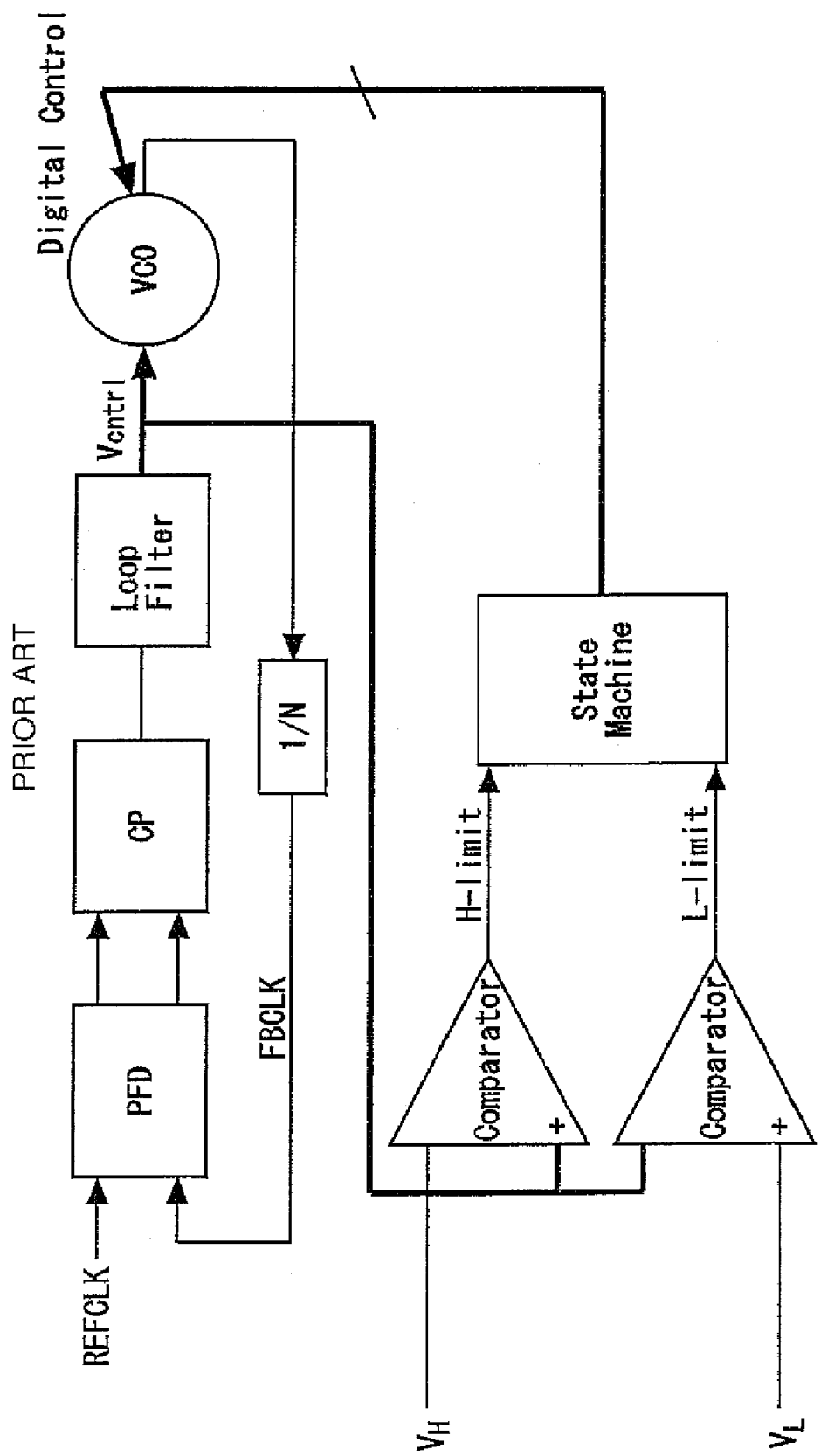
FIG. 13 is a block diagram of an automatic frequency correction PLL circuit of prior art 3.

FIG. 9 shows an embodiment in which the automatic frequency correction PLL circuit according to the present invention is applied to control of a plurality of PLL circuits. When similar voltage-controlled oscillator circuits VCO exist in the same semiconductor chip, process variations, environment fluctuations such as temperature are considered common to the respective voltage-controlled oscillator circuits VCO. For this reason, it is possible to monitor one offset frequency using one PLL circuit and apply the digital control to other PLL circuits. In this case, it is possible to correct the offset frequencies of the other PLL circuits using the frequency correction function of one PLL circuit.

In FIG. 9, $PLL_0, PLL_1, ..., PLL_N$ are PLL circuits provided with a voltage-controlled oscillator circuit VCO. Among these PLL circuits, $PLL_0$ is the automatic frequency correction PLL circuit shown, for example, in Embodiments 1 to 4. Digital control signals (Digital Control) are supplied from this PLL circuit $PLL_0$ to the PLL circuits $PLL_1, ..., PLL_N$ and a lock completion signal (Lock Completion) is also supplied.

The automatic frequency correction PLL circuit according to the present invention is applied to a PLL circuit used for transmission of signals such as image transmission.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2004-113725, filed on Apr. 8, 2004 including specification, claims, drawings and summary, on which the Convention priority of the present application is based, are incorporated herein by reference in its entirety.

What is claimed is:

1. An automatic frequency correction phase-locked loop (PLL) circuit comprising:

an analog control circuit which generates an analog control voltage; and a digital control circuit which generates a digital control signal and which comprises a High-side comparator which receives the analog control voltage and compares the analog control voltage with a High-side threshold voltage, a Low-side comparator which receives the analog control voltage and compares the analog control voltage with a Low-side threshold voltage, a state monitor circuit which receives outputs of the High-side comparator and the Low-side comparator and monitors state of offset frequencies, and a counter and decoder which generates the digital control signal under control of the state monitor circuit, wherein at least one of the High-side comparator and the Low-side comparator includes a threshold switching circuit which selectively provides one of a first threshold voltage and a second threshold voltage, the first and second threshold voltages having different magnitudes, and, when the analog control voltage is stable between the High-side threshold voltage and the Low-side threshold voltage and the threshold switching circuit has provided the first threshold voltage, the state monitor circuit switches the threshold switching circuit from providing the first threshold voltage to providing the second threshold voltage, thereby expanding an interval between the High-side threshold voltage and the Low-side threshold voltage.

2. The automatic frequency correction PLL circuit according to claim 1, including a respective threshold switching circuit for each of the High-side comparator and the Low-side comparator, wherein, when the analog control voltage remains stable between the High-side threshold voltage and the Low-side threshold voltage and the first threshold voltage is provided to the High-side comparator as a High-side threshold voltage, and the first threshold voltage is provided to the Low-side comparator as a Low-side threshold voltage, the state monitor circuit switches both the High-side threshold voltage applied to the High-side comparator and the Low-side threshold voltage applied to the Low-side comparator from the first threshold voltage to the second threshold voltage, thereby expanding the interval between the High-side threshold voltage and the Low-side threshold voltage at both the High-side comparator and the Low-side comparator.

3. The automatic frequency correction PLL circuit according to claim 1, wherein the threshold switching circuit is included for only one of the High-side comparator and the Low-side comparator, and, when the analog control voltage remains stable between the High-side threshold voltage and the Low-side threshold voltage and the threshold switching circuit provides the first threshold voltage, only one of the High-side threshold voltage applied to the High-side comparator and the Low-side threshold voltage applied to the Low-side comparator is switched by the state monitor circuit from the first threshold voltage to the second threshold voltage, thereby expanding the interval between the High-side threshold voltage and the Low-side threshold voltage.

4. The automatic frequency correction PLL circuit according to claim 1, wherein a maximum adjustment unit of an offset frequency according to the analog control voltage is set to be larger than an adjustment unit of an offset frequency according to the digital control signal.

5. The automatic frequency correction PLL circuit according to claim 2, wherein a maximum adjustment unit of an offset frequency according to the analog control voltage is set to be larger than an adjustment unit of an offset frequency according to the digital control signal.

6. The automatic frequency correction PLL circuit according to claim 3, wherein a maximum adjustment unit of an offset frequency according to the analog control voltage is set to be larger than an adjustment unit of an offset frequency according to the digital control signal.

7. The automatic frequency correction PLL circuit according to claim 1, wherein, after the interval between the High-side threshold voltage and the Low-side threshold voltage is expanded, the stat monitor circuit restores the interval between the High-side threshold voltage and the Low-side threshold voltage to an original interval and automatically corrects the offset frequency again;

8. The automatic frequency correction PLL circuit according to claim 2, wherein, after the interval between the High-side threshold voltage and the Low-side threshold voltage is expanded, the state monitor circuit restores the interval between the High-side threshold voltage and the Low-side threshold voltage to an original interval and automatically corrects the offset frequency again.

9. The automatic frequency correction PLL circuit according to claim 3, wherein, after the interval between the High-side threshold voltage and the Low-side threshold voltage is expanded, the state monitor circuit restores the interval between the High-side threshold voltage and the Low-side threshold voltage to an original interval and automatically corrects the offset frequency again.

10. The automatic frequency correction PLL circuit according to claim 1, wherein the automatic frequency correction PLL circuit supplies the digital control signal to other PLL circuits.

11. The automatic frequency correction PLL circuit according to claim 2, wherein the automatic frequency correction PLL circuit supplies the digital control signal to other PLL circuits.

12. The automatic frequency correction PLL circuit according to claim 3, wherein the automatic frequency correction PLL circuit supplies the digital control signal to other PLL circuits.

* * * * *